(12) United States Patent
Cristaldi (10) Patent No.: US 9,184,150 B2
(45) Date of Patent: Nov. 10, 2015

(54) ELECTRONIC DEVICE WITH BIMETALLIC INTERFACE ELEMENT FOR WIRE BONDING

(71) Applicant: STMicroelectronics S.r.l., Agrate Brianza (IT)

(72) Inventor: Giuseppe Cristaldi, Sicily (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/487,559

(22) Filed: Sep. 16, 2014

(65) Prior Publication Data

US 2015/0076712 A1    Mar. 19, 2015

(30) Foreign Application Priority Data

Sep. 17, 2013 (IT) ............................. MI2013A1530

(51) Int. Cl.
*H01L 23/48* (2006.01)
*H01L 23/52* (2006.01)
(Continued)

(52) U.S. Cl.
CPC ............... *H01L 24/48* (2013.01); *H01L 24/03* (2013.01); *H01L 24/45* (2013.01); *H01L 24/85* (2013.01); *H01L 24/78* (2013.01); *H01L 2224/05624* (2013.01); *H01L 2224/45014* (2013.01); *H01L 2224/45015* (2013.01); *H01L 2224/45032* (2013.01); *H01L 2224/45124* (2013.01); *H01L 2224/45147* (2013.01); *H01L 2224/48091* (2013.01); *H01L 2224/48137* (2013.01); *H01L 2224/48247* (2013.01); *H01L 2224/48472* (2013.01); *H01L 2224/48491* (2013.01);
(Continued)

(58) Field of Classification Search
CPC ......... H01L 23/48; H01L 23/52; H01L 29/40; H01L 2924/01079; H01L 2924/01029
USPC .......................................... 257/779, 777, 782
See application file for complete search history.

(56) References Cited

U.S. PATENT DOCUMENTS 5,994,212 A    11/1999 Arakawa et al.
2008/0006945 A1*  1/2008 Lin et al. ...................... 257/758
(Continued)

FOREIGN PATENT DOCUMENTS

JP    S54146960 A    11/1979
JP    S58171838 A    10/1983
(Continued)

OTHER PUBLICATIONS

Italian Search Report and Written Opinion for IT MI2013A001530 mailed Jul. 7, 2014 (15 pages).
(Continued)

*Primary Examiner* — Phuc Dang
(74) *Attorney, Agent, or Firm* — Gardere Wynne Sewell LLP (57) ABSTRACT

An electronic device includes a chip with an integrated electronic component and a terminal made of a first metal material. The device further includes a lead made of a second metal material different from the first metal material. A bonding wire made of a selected one of the first and second metal materials has opposite ends coupled with the terminal and the lead. An interface element having a first layer made of a selected one of the first and second metal materials and a second layer made of an unselected one of the first and second metal materials has the first layer coupled with the bonding wire and the second layer coupled with a component, wherein the component is ether the terminal or the lead.

16 Claims, 7 Drawing Sheets

(51) Int. Cl.
*H01L 29/40* (2006.01)
*H01L 23/00* (2006.01)

(52) U.S. Cl.
CPC ............... *H01L2224/48724* (2013.01); *H01L 2224/48824* (2013.01); *H01L 2224/49111* (2013.01); *H01L 2224/49113* (2013.01); *H01L 2224/7855* (2013.01); *H01L 2224/78313* (2013.01); *H01L 2224/83203* (2013.01); *H01L 2224/83801* (2013.01); *H01L 2224/85051* (2013.01); *H01L 2224/85181* (2013.01); *H01L 2224/85205* (2013.01); *H01L 2224/85207* (2013.01); *H01L 2924/0132* (2013.01); *H01L 2924/15747* (2013.01)

(56) References Cited

U.S. PATENT DOCUMENTS

2010/0133688 A1* 6/2010 Shigihara et al. ............ 257/738
2012/0211900 A1* 8/2012 Choi et al. .................... 257/782

FOREIGN PATENT DOCUMENTS

JP        S6010763 A     1/1985
JP        S61154042 A    7/1986

OTHER PUBLICATIONS

Dwight Schwarz et al: "Leadframe Attached Composite Rivet/Weld Button for Electrical Interconnect (Dwight Schwarz, Bill Mummert, Steve Baker)," Research Disclosure, Mason Publications, Hampshire, GB, vol. 325, No. 71, May 1, 1991, XP007116398, whole document (2 pages).

George G. Harman Ed—Harman George G: "Wire Bonding in Microelectronics Materials, Processes, Reliability, and Yield, How Ultrasonic Bonds Are Made," Jan. 1, 1997, Wire Bonding in Microelectronics Materials, Processes, Reliability, and Yield 2Ed. [Electronic Packaging and Interconnection Series], McGraw-Hill, USA, pp. 18-23, XP002534712.

* cited by examiner

ELECTRONIC DEVICE WITH BIMETALLIC INTERFACE ELEMENT FOR WIRE BONDING

PRIORITY CLAIM

This application claims priority from Italian Application for Patent No. MI2013A001530 filed Sep. 17, 2013, the disclosure of which is incorporated by reference.

TECHNICAL FIELD

The present disclosure relates to the field of electronics. More in detail, the present disclosure relates to electronic devices.

BACKGROUND

In general, any electronic device comprises one chip or more (e.g., of semiconductor material) on which one or more actual electronic components are integrated. The chip is typically encapsulated in a package comprising an insulating body, for example, of polymeric material, in order to be insulated and protected from the external environment. The package includes electrically conductive leads exposed from the insulating body, which leads are coupled with corresponding electrically conductive terminals, for example, contact pads of the chip. The leads act as electrical interface elements between the chip and the external environment (i.e., for the connection of the electronic components with other electric/electronic elements).

Typically, the contact pads are electrically coupled with the corresponding leads through circular cross-section or flat rectangular cross-section bonding wires of electrically conductive material. In jargon, this operation is called wire-bonding.

In general, the pads are made of an electrically conductive material comprising one or more metal elements. For example, the contact pads are usually formed by means of a metallization layer comprising aluminum (Al) or an alloy comprising aluminum (such as AlSi or AlSiCu) deposited during the manufacturing of the electronic components on the chip.

Similarly, the bonding wires and the leads are formed of an electrically conductive material comprising one or more metal elements as well. In particular, the material of the bonding wires and of the leads may be different from the material of the contact pads. For example, the use of materials comprising copper (Cu) is preferred for the manufacturing of the bonding wires and the leads due to the high conductivity (both electric and thermal) of such a metal element.

Consequently, during the manufacturing of the electronic device the operation of wire bonding comprises soldering, to the contact pads of a material (e.g., comprising aluminum), the bonding wires of another material (e.g., comprising copper).

However, the different metal elements included in such materials determine different thermal expansion coefficients (for example, aluminum has a thermal expansion coefficient that is approximately double than a thermal expansion coefficient of copper). This difference between the thermal expansion coefficients may cause a weakening of the soldering between the two materials, particularly when the electronic device is used in a system subject to high operating temperature and/or substantial temperature changes; for example, this may occur in outdoor applications and/or by Joule effect due to (possibly varying) electric currents that cross an electric connection formed by the lead, the contact pad and the bonding wire.

The weakening of the soldering is exacerbated when the electronic device is used in a system subject to mechanical stresses of not negligible intensity (for example, in automotive applications, in industrial machinery, but also in portable applications). In fact, the mechanical stresses in combination with the high operating temperatures and/or the substantial temperature changes may lead to a rupture of the soldering and to a detachment of the bonding wire from the pad (event also known as "bond lift-off") or to the development of cracks in the bonding wire at the interface between a portion of the bonding wire soldered to the contact pad and a portion of the bonding wire separated therefrom (event also known as "heel crack").

This weakening of the structure may cause a reduction, or even an interruption, of a flow of electric current through these bonding wires (for example, generated by input/output signals or by a power supply of the device), with the consequence of reducing an efficiency of the electronic device, down to prevent the performing of the operations for which it is designed.

SUMMARY

A simplified summary of the present disclosure is herein presented in order to provide a basic understanding thereof; however, the sole purpose of this summary is to introduce some concepts of the disclosure in a simplified form as a prelude to its following more detailed description, and is not be understood as an indication of its key elements nor as a delimitation of its scope.

In general terms, the present disclosure is based on the idea of using an interface element with two layers of different materials.

In particular, an aspect provides an electronic device comprising at least one interface element having two layers of corresponding different materials, each comprising a different metal element. A layer of the interface element is coupled with a bonding wire of a material comprising the metal element of the layer. The other layer of the interface element is coupled with a contact terminal of a chip of the electronic device or with a lead of the electronic device of a material comprising the metal element of such other layer.

Another aspect provides a corresponding method for manufacturing an electronic device.

In particular, one or more aspects of the present disclosure are set out in the independent claims and advantageous features thereof are set out in the dependent claims, with the wording of all the claims that is herein incorporated verbatim by reference (with any advantageous features provided with reference to a specific aspect that apply mutatis mutandis at any other aspect).

BRIEF DESCRIPTION OF THE DRAWINGS

The solution of the present disclosure, as well as additional features and its advantages, will be better understood with reference to the following detailed description, given purely by way of indication and without limitation, to be read in conjunction with the attached figures (wherein corresponding elements are denoted with equal or similar references and their explanation is not repeated for the sake of brevity). In this respect, it is expressly intended that the figures are not necessarily to scale (with some details that may be exaggerated and/or simplified) and that, unless otherwise indicated, they are simply used to conceptually illustrate the described structures and procedures. In particular.

DETAILED DESCRIPTION OF THE DRAWINGS

Figure 1:
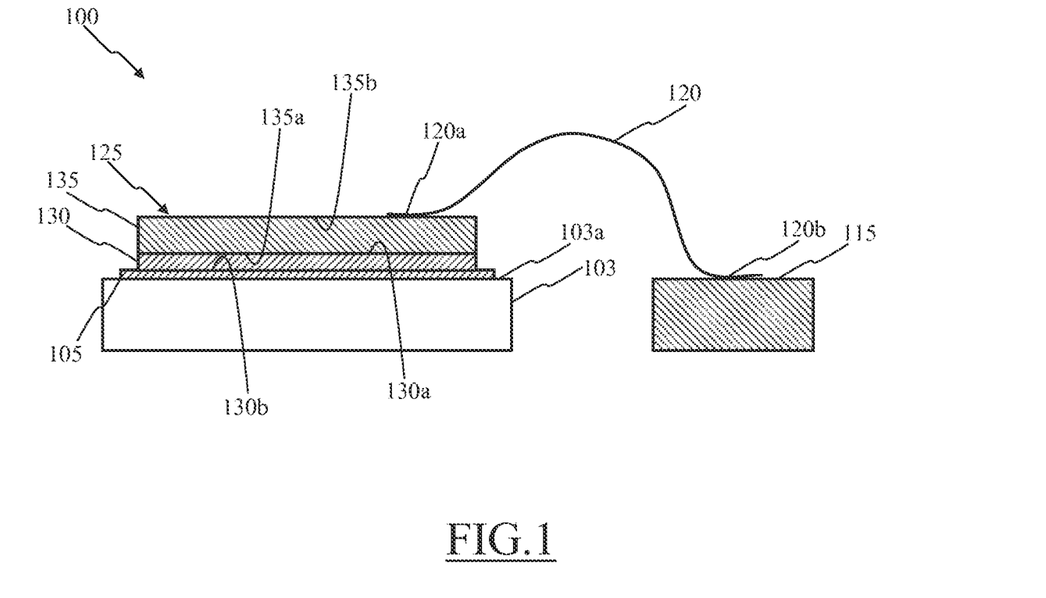
FIG. 1 illustrates a schematic cross-sectional side view of a connection between a terminal of a chip and a lead in an electronic device according to an embodiment of the present disclosure.

With reference to FIG. 1, it illustrates a schematic cross-sectional side view of a connection between a terminal of a chip and a lead in an electronic device 100 according to an embodiment of the present disclosure.

The chip (indicated by the reference 103) is, for example, made of semiconductor material and integrates one or more electronic components, not visible (for example, a single transistor or a complex system such as a microprocessor).

In order to allow an access (from the electric point of view) to the electronic components inside the chip 103, one or more terminals are formed on at least one surface 103a thereof, for example, one or more contact pads (of which only a contact pad indicated by the reference 105 is visible in the figure). The contact pad 105 is formed by a step of metal layer deposition during a manufacturing process of the chip 103. The contact pad 105 is formed of a (pad) material that predominantly comprises a specific metal element (e.g., greater than 80%, preferably greater than 90% and even more preferably greater than 95% by weight). Generally, the material of the pad comprises aluminum (Al); for example, the pad material may be simply aluminum (Al), an alloy of aluminum and silicon (AlSi) or an alloy of aluminum, silicon and copper (AlSiCu).

The chip 103 and consequently the contact pad 105 as well are encapsulated in an insulating package (omitted in FIG. 1 for simplicity) from which one or more leads are exposed (of which only one lead indicated by the reference 115 is visible in the figure). The lead 115 is substantially a parallelepiped made of a (lead) material that predominantly comprises (as above) a different metal element with respect to the metal material of the pad. For example, the lead material may be copper (Cu) (because of its high thermal and electric performance).

The electric connection between the lead 115 and the contact pad 105 is made via one bonding wire 120 (or more) made of a specific (wire) material as well. Such a wire material as well predominantly comprises (as above) the same metal element of the lead material, i.e., copper (Cu) in the example at issue.

In an embodiment of the present disclosure, an interface element 125 is provided between the contact pad 105 and the bonding wire 120. The interface element 125 comprises two layers 130 and 135 made of different metal materials, each of which predominantly comprises (as above) a metal element different from the other. In particular, the layer 130 is made of a material predominantly comprising the same metal element of the pad material (i.e., aluminum in the example at issue). The layer 135 is made of a material predominantly comprising the same metal element of the wire/lead material (i.e., copper in the example at issue).

For example, the interface element 125 is a bimetal strip formed by the layer (or foil) 130 and by the layer (or foil) 135 firmly coupled with each other via their respective main surfaces 130a and 135a (for example, through a rolling or compression operation). Each layer 130 and 135 has a free main surface 130b and 135b, respectively, opposite the corresponding main surface 130a or 135a.

In the embodiment of FIG. 1, the interface element 125 is coupled (e.g., soldered) with the contact pad 105 at the free main surface 130b of the layer 130; in this way, there is obtained a coupling between two elements made of materials comprising the same lead metal element, i.e., aluminum. The free main surface 135b of the second layer 135 is coupled (e.g., soldered) with one end 120a of the bonding wire 120; in this case as well, there is obtained a coupling between two elements made of materials comprising the same wire/lead metal element, i.e., copper. Another end 120b of the bonding wire 120 is coupled (e.g., soldered) with the lead 115 (which are already made of materials comprising the same wire/lead metal element).

Thanks to the use of the interface element 125 described above it is possible to obtain a coupling (and in particular a soldering) between metallic materials comprising the same metal element even when the contact pad 105 and the bonding wire 120 are made of metallic materials including different metal elements.

This provides a particularly robust and reliable electric connection even in the case of operating conditions characterized by high operating temperatures and/or substantial temperature changes, especially when the electronic device is used in a system subject to mechanical stresses of not negligible intensity (as in automotive, industrial machinery applications, but also in portable applications).

The solution described above reduces the risk of breaking of the soldering and of detachment of the bonding wire 120 from the contact pad 105 ("bond lift-off"), as well as of cracks in the bonding wire 120 at the interface between a portion of the bonding wire 120 soldered to the contact pad 105 and a portion of the bonding wire 120 separated therefrom ("heel crack").

All of the above increases an efficiency of the electronic device in performing the operations for which it is designed.

Figure 2:
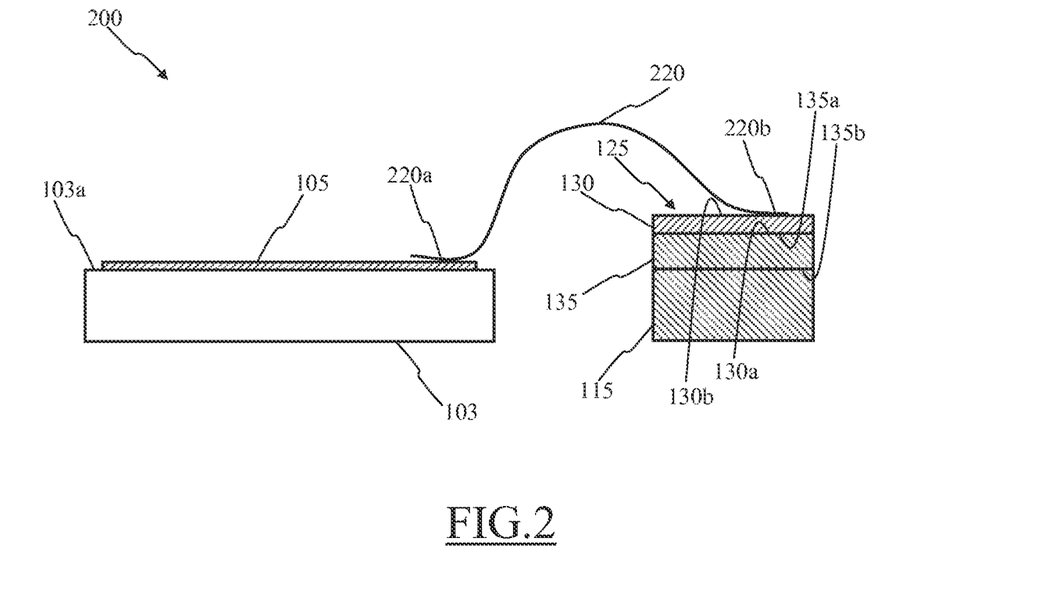
FIG. 2 illustrates a schematic cross-sectional side view of a connection between a terminal of a chip and a lead in an electronic device according to another embodiment of the present disclosure.

Turning now to FIG. 2, it illustrates a schematic cross-sectional side view of a connection between a terminal of a chip and a lead in an electronic device according to another embodiment of the present disclosure.

The electric connection differs from the electric connection previously described as follows.

In this case, in the electronic device (differentiated with the reference 200) a bonding wire 220 is made of a wire metallic material predominantly comprising (as above) the same lead metal element (e.g., aluminum).

The interface element 125 is now provided between the bonding wire 220 and the lead 115. In detail, the interface element 125 is coupled (e.g., soldered) to the lead 115 through the free main surface 135b of the layer 135; in this way, there is obtained a coupling between two elements made of materials comprising the same lead metal element, i.e., copper. The free main surface 130b of the layer 130 is coupled (e.g., soldered) to one end 220b of the bonding wire 220; in this case as well, there is obtained a coupling between two elements made of materials comprising the same wire/lead metal element; i.e., aluminum. Another end 220a of the bonding wire 220 is coupled (e.g., soldered) to the contact pad 105 (which are already made of metallic materials comprising the same wire/pad metal element).

In this case as well, thanks to the use of the interface element 125 it is possible to obtain a coupling (and in particular a soldering) between metallic materials comprising the same metal element even when the lead 115 and the bonding wire 120 are made of metallic materials comprising different metal elements, with the same benefits described above.

FIGS. 3A-3D illustrate the main steps of a wire-bonding operation in an electronic device according to an embodiment of the present disclosure.

In detail, there is described the soldering of the bonding wire 120 to the contact pad 105 with the interface element 125 (attached thereto as described below) and to the lead 115.

For this purpose, there is used a coupling apparatus, such as a soldering apparatus 305 (e.g., an apparatus for ultrasonic soldering or thermosonic bonding)—of which only an end portion is visible in the FIGS. 3A-3D.

Generally, the soldering apparatus 305 includes a dispensing element 310 adapted to carry a wire reel 315, a soldering element 320 adapted to perform ultrasonic soldering, and a cutting element 325 arranged between the dispensing element 310 and the soldering element 320 adapted to cut the wire reel 315. As it is known, the soldering apparatus 305 further comprises circuitry and electromechanical systems necessary for its operation (not shown in the figures for simplicity).

Initially (FIG. 3A), on the interface element 125 there is positioned a (free) end portion 315a of the wire reel 315 provided in the dispensing element 310.

Figure 3A:
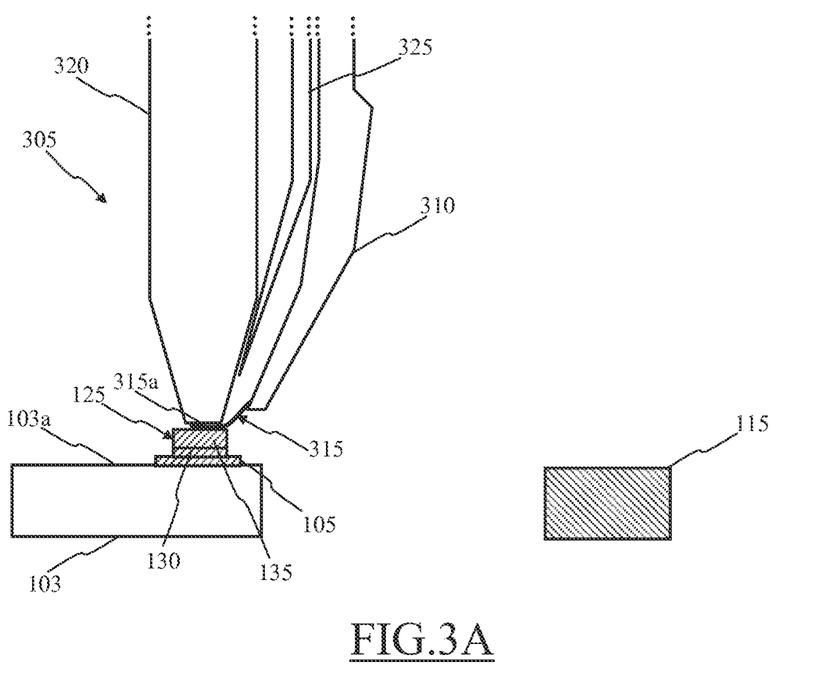
FIGS. 3A-3D illustrate the main steps of a wire-bonding operation in an electronic device according to an embodiment of the present disclosure.
Figure 3B:
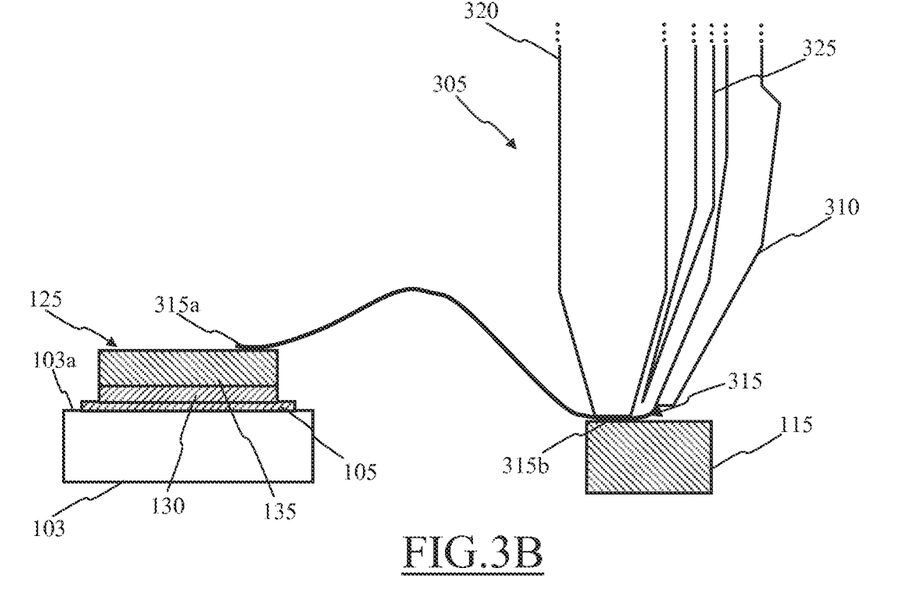
Figure 3C:
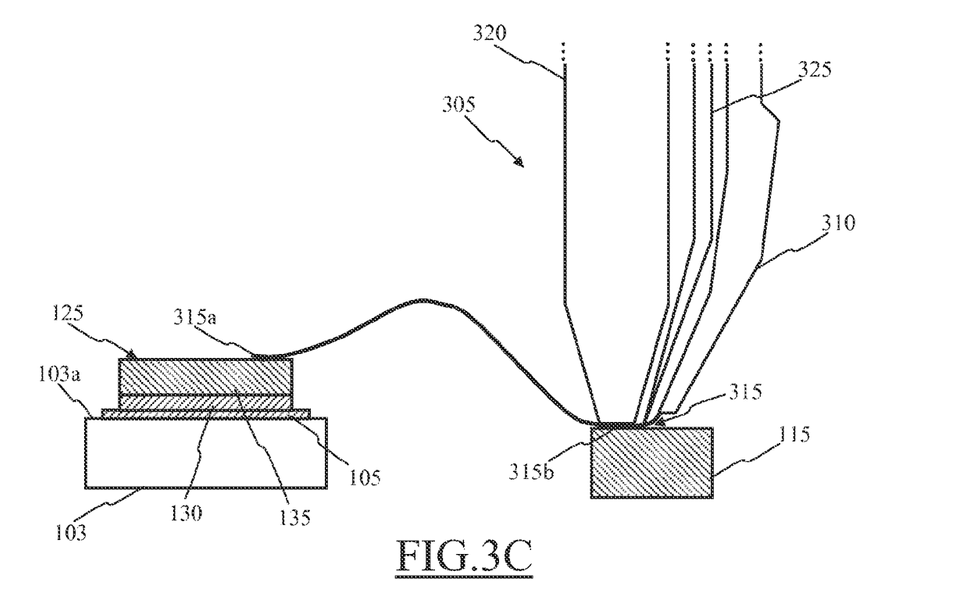

The positioning of the end portion 315a requires that the dispensing element 310 should dispense the end portion 315a in the direction of the soldering element 320. Preferably, the dispensed end portion 315a has an extent substantially smaller than or at most equal to an extent of the contact pad 105.

The soldering element 320 receives and holds the end portion 315a (thanks to a geometric shape with which a soldering portion of the soldering element 320 is made) and the soldering apparatus 305 is then actuated to align the end portion 315a with the interface element 125. For example, the alignment may be automatically handled by a processor that manages the operation of the soldering apparatus 305 according to relative position information, between the end portion 315a and the interface element 125 arranged on the contact pad 105, obtained through the acquisition and the processing of images (for example, via a video capture system comprised in the soldering apparatus 305 or connected thereto).

After having aligned the end portion 315a and the interface element 125, the soldering element 320 pushes the end portion 305a towards the chip 103 down to contact the interface element 125. The soldering element 320 maintains pressed (action also indicated as "over-travel") the end portion 315a against the interface element 125 so as to facilitate the subsequent soldering thereof (thereby completing the positioning of the end portion 315a).

Subsequently, the soldering is started in such a way to join together the end portion 315a with the interface element 125. For example, in the case where the soldering apparatus 305 performs an ultrasonic soldering, the soldering element 305 is caused to vibrate at a frequency comprised between 60 KHz and 80 KHz (although alternative ranges of vibration frequencies are not excluded). The vibration (and an energy associated therewith) is transferred from the soldering element 320 to the end portion 315a in such a way to lead to a melting at least partially of the end portion 315a, which then binds to the interface element 125.

The wire reel 315a is unwound by the dispensing element 310 until its connecting portion 315b reaches the lead 115, where such connection portion 315b is positioned and then soldered to the lead 115 by means of the soldering apparatus 305 in a manner similar to that described above (FIG. 3B).

The cutting element 325 is then lowered toward the lead 115 (FIG. 3C) in such a way to cut at least partially the connecting portion 315b. For example, the cutting element 325 may be lowered down to cause a cut that extends to a depth between 50-90%, preferably 60-85% and even more preferably 70-80%, such as 75%, of a total thickness of the connecting portion 315b.

Then, the soldering apparatus 305 is moved away from the lead 115 (as conceptually indicated with an arrow in FIG. 3D) in such a way to separate the connecting portion 315b from the remaining wire reel 315 (action also indicated as "pulling and breaking"). In other words, the soldering apparatus 305 is moved away from the connecting portion 315b with a movement such as to remove a residual connection (not visible in the figures) possibly still connecting the connecting portion 315b to the wire reel 315.

Figure 3D:
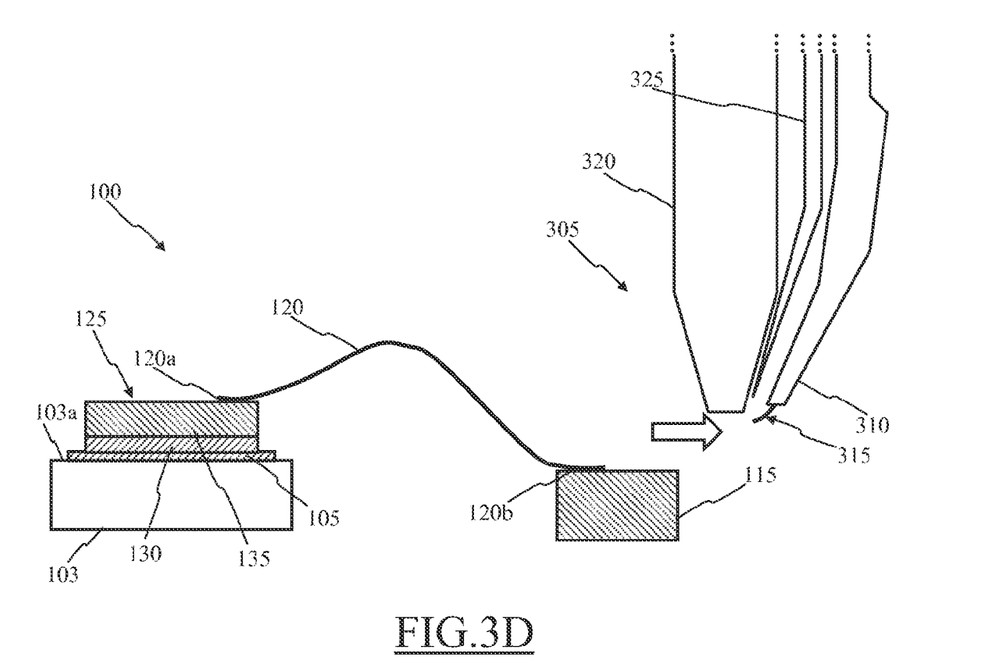

The (end and connection) portions 315a, 315b thus separated from the wire reel 315 generate the bonding wire 120, which is already soldered to both the interface element 125 and the lead 115.

Figure 4A:
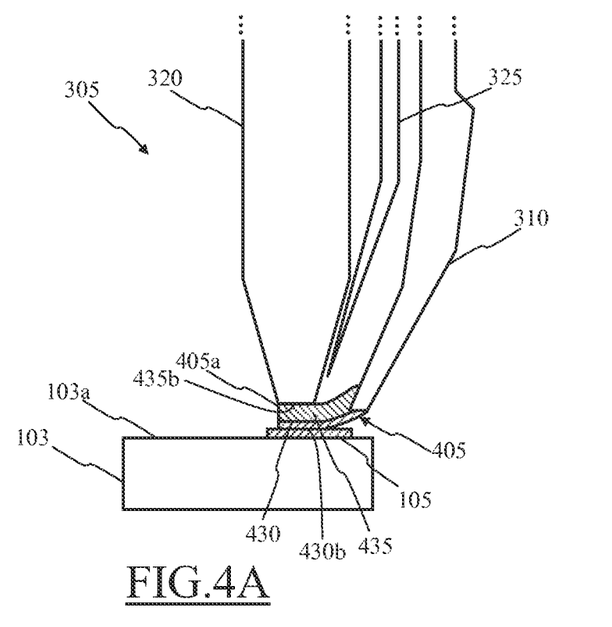
FIGS. 4A-4C illustrate the main steps of a manufacturing method of an electronic device according to an embodiment of the present disclosure.
Figure 4B:
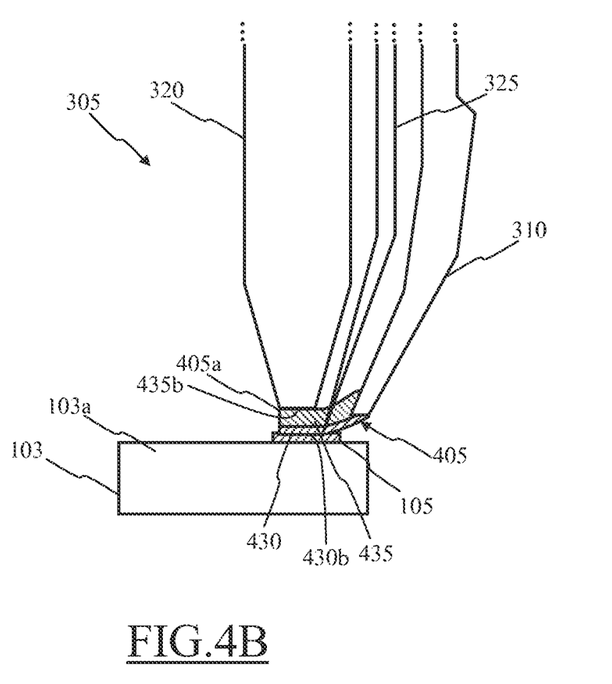
Figure 4C:
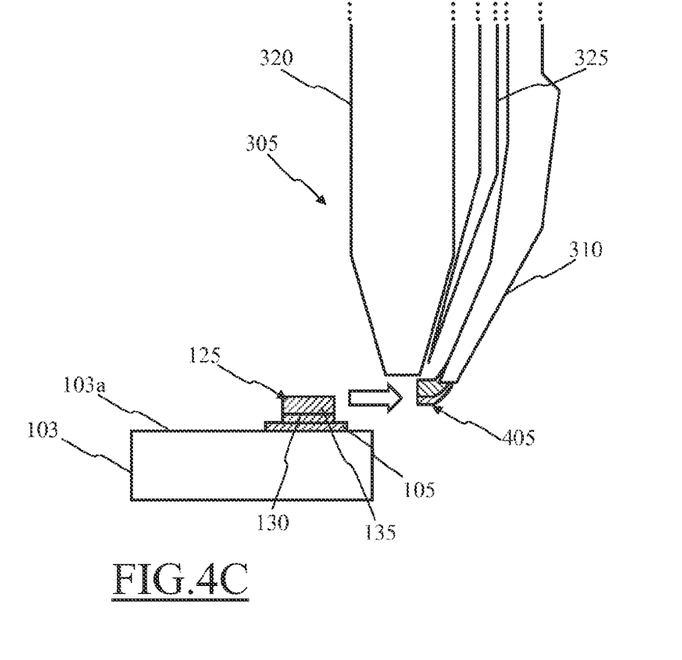

Considering jointly the FIGS. 4A-4C, they illustrate the main steps of a manufacturing method of an electronic device according to an embodiment of the present disclosure.

Particularly, such method regards the formation of the electric connection described with reference to FIG. 1.

In the solution according to an embodiment of the present disclosure, in order to form the electric connection between the contact pad 105 and the lead 115 the same coupling apparatus is used, and in particular the same soldering apparatus 305, which is already used to perform the wire-bonding.

In this case, the soldering apparatus 305 is provided with a tape reel 405 (replacing the wire reel 315 of FIGS. 3A-3D).

As described in detail below, the tape reel 405 is adapted to form the interface element. For this purpose, the tape reel 405 comprises a layer (or foil) 430 corresponding to the layer of the interface element to be coupled with the contact pad (having a free main surface 430b) and a layer (or foil) 435 corresponding to the layer of the interface element to be coupled with the bonding wire (having a free main surface 435b) (for example, a reel of bimetallic tape).

Initially (FIG. 4A), a (free) end portion 405a of the tape reel 405 dispensed by the dispensing element 310 is positioned on the contact pad 105 of the chip 103 as above. Preferably, the delivered end portion 405a has an extent substantially smaller than or at most equal to an extent of the contact pad 105 (e.g., with a length equal to 50-90%, preferably equal to 60-80%, and still more preferably equal to 65-75%, such as equal to 70% of the extent of the contact pad 105 in the same direction).

The soldering element 320 receives and holds the end portion 405a in correspondence to the free main surface 435b of the layer 435. The soldering apparatus 305 is then actuated to align the end portion 405a with the contact pad 105 (in this case as well, the alignment may be managed automatically as described above).

After having aligned the end portion 405a and the contact pad 105, the soldering element 320 pushes the end portion 405a towards the chip 103 down to contact the contact pad 105. The soldering element 320 maintains the end portion 405a pressed against the contact pad 105 in such a way to facilitate the subsequent soldering thereof (thereby completing the positioning of the end portion 405a).

Subsequently, the soldering is started in such a way to join together the end portion 405a with the contact pad 105. For example, again in the case where the soldering apparatus 305 performs ultrasonic soldering, the vibration of the soldering element 320 is transferred to the end portion 405a in such a way to lead to the melting at least partial of its layer 430, which then binds to the contact pad 105.

The cutting element 325 is then lowered toward the contact pad 105 (FIG. 4B) in such a way to cut at least partially (as above) the end portion 405a as described above.

Then, the soldering apparatus 305 is moved away from the contact pad (as conceptually indicated with an arrow in FIG. 4C) in such a way to separate the end portion 405a from the remaining tape reel 405 as above.

The end portion 405a thus separated from the tape reel 405 generates the interface element 125, which is already soldered to the contact pad 105 through the layer 130.

Thanks to the method just described it is possible to provide the interface element 125 properly soldered to the contact pad 105 through an extremely reduced number of steps and without the use of dedicated equipment.

Turning now to FIGS. 5A-5D, they illustrate the main steps of a manufacturing method of an electronic device according to another embodiment of the present disclosure.

The method differs from the method described with reference to FIGS. 4A-4C as follows.

A service element 540, for example, a neutral voltage region electrically insulated from the chip 103 and the lead 115 (as a floating region), is provided in the electronic device. The service element 540 is substantially a block physically separated and/or electrically insulated from both the chip 103 and the lead 115; preferably, the service element 540 is made of the same material of the lead (or at least preponderantly comprises as above the same metal element).

Initially, there is carried out the positioning and the soldering of the end portion 405a of the tape reel 405 on the contact pad 105 (FIG. 5A) by the soldering apparatus 305 in a similar way as described above.

The tape reel 405 is now unwound until an intermediate portion 505b reaches the service element 540, where the intermediate portion 505b is positioned and then soldered to the service element 540 by means of the soldering apparatus 305 in a similar way as described above (FIG. 5B).

Subsequently, the cutting element 325 is lowered towards the service element 540 (FIG. 5C) in such a way to cut at least partially (as above) the intermediate portion 505b.

Then, the soldering apparatus 305 is moved away from the service element (as conceptually indicated with an arrow in FIG. 5D) in such a way to separate the intermediate portion 505b from the remaining tape reel 410 as described above.

Figure 5A:
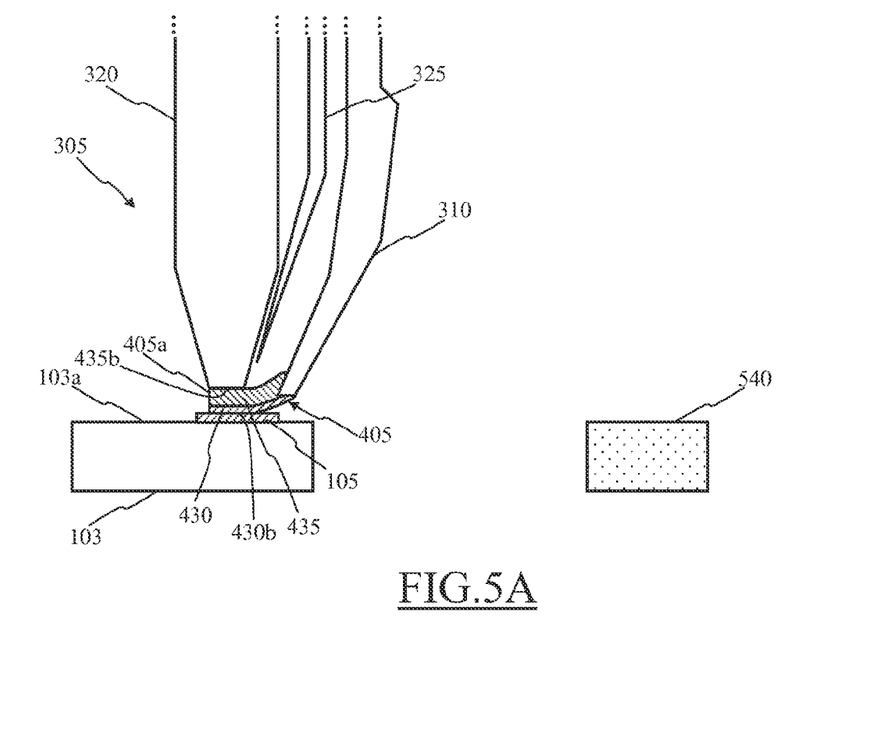
FIGS. 5A-5E illustrate the main steps of a manufacturing method of an electronic device according to another embodiment of the present disclosure.
Figure 5B:
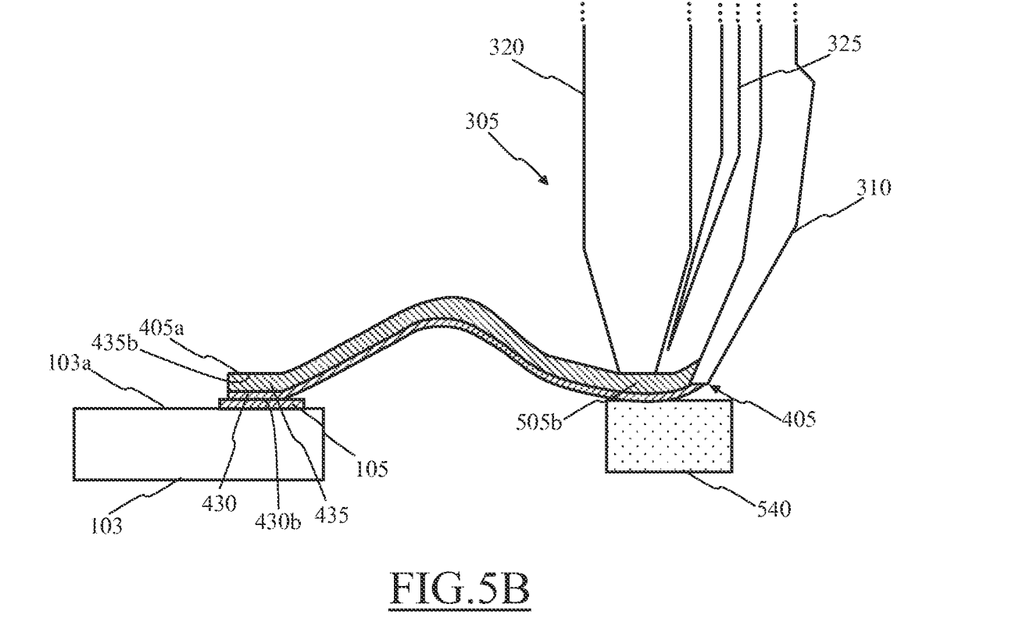
Figure 5C:
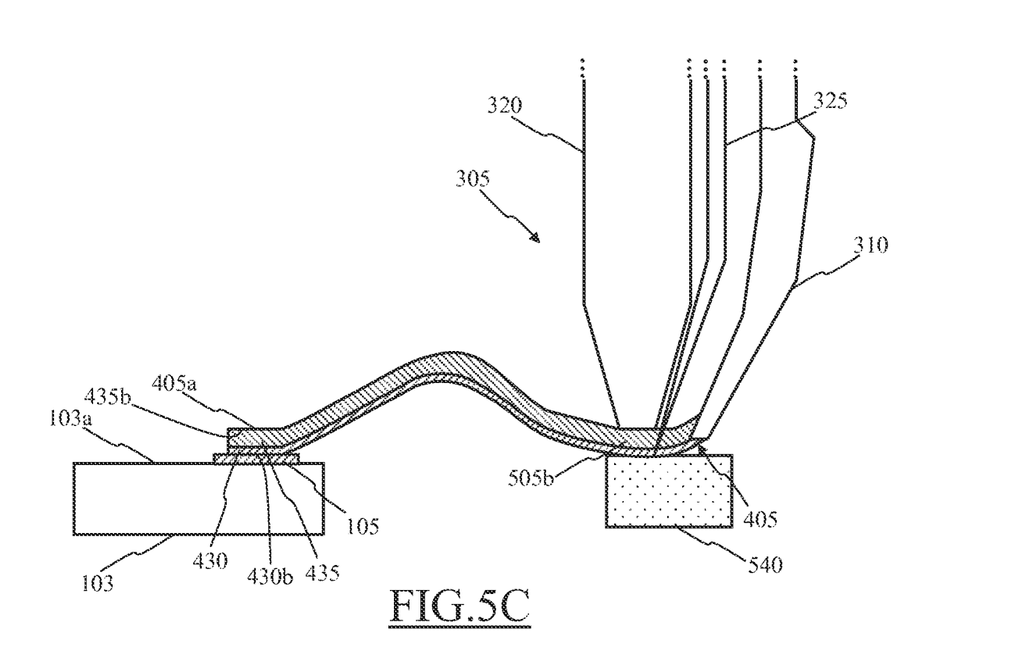
Figure 5D:
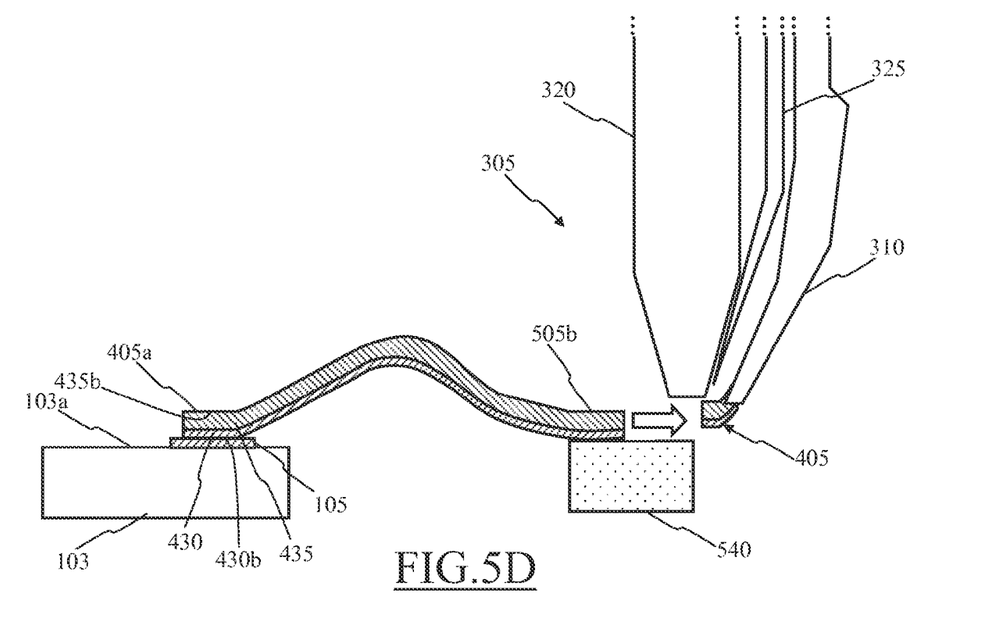
Figure 5E:
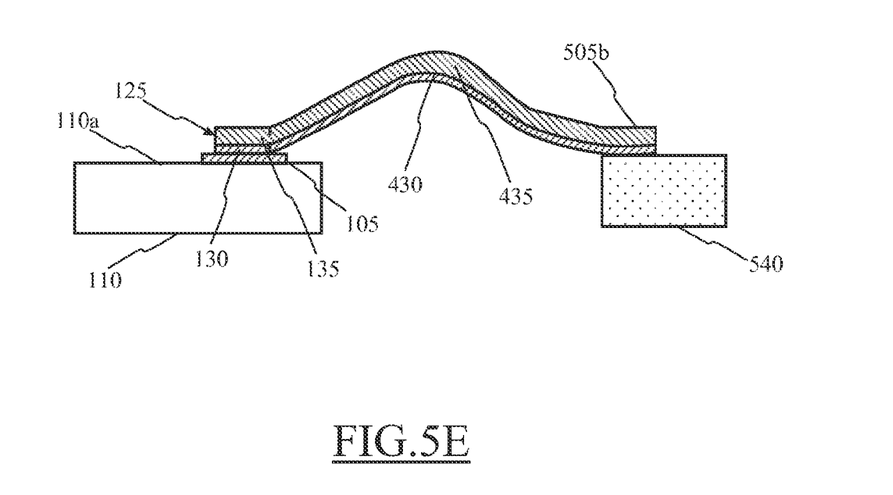

In this way, there is again defined the interface element 125, which substantially corresponds to the end portion thus separated from the tape reel 405, although formed integrally with the intermediate portion 505b. This does not involve substantial changes in the electronic device since the intermediate portion 505b remains connected to the potentially neutral service element 540. Advantageously, the service element 540 is arranged in such a way that the intermediate portion 505b between it and the interface element 125 does not hinder a subsequent coupling of the bonding wire with the interface element 125 and with the lead 115; for example, the service element 540 defines, with the contact pad 105, a direction transversal to a direction defined by the contact pad 105 and the lead 115 (for example, forming an angle of 60-120°, preferably 70-110°, and still more preferably 80-100°, such as 90°).

Thanks to the method just described, it is possible to provide the interface element 125 through the soldering apparatus 305 using a procedure that substantially corresponds to a procedure used for the soldering of the bonding wire 120; i.e., it is not necessary to program a control system (not shown) of the apparatus 305 to perform a soldering procedure dedicated to the manufacturing of the interface element 125. Moreover, the method just described does not perform a cutting step at the chip 103; therefore, any risk is avoided of damaging the chip 103 due to a possible excessive lowering of the cutting element 325 or due to the separation of the intermediate portion 505b from the remaining tape reel 405 (i.e., such as to cause an incision of the contact pad 105 and/or the chip 103).

In an alternative embodiment (not shown), a service element separated from the electronic device is provided. After soldering the intermediate portion to that service element, the intermediate portion is cut at least partially in correspondence to the end portion; afterwards, the service element is moved away from the chip in such a way to separate the end portion from the intermediate portion thereby obtaining the stand-alone interface element.

This embodiment avoids leaving added elements (i.e., the service element and the intermediate portion) in the electronic device (but at the cost of an additional process step).

It should be noted that the steps of the methods described above in relation to FIGS. 3A-3D, to FIGS. 4A-4C and to FIGS. 5A-5E, may also be applied mutatis mutandis to the electronic device described in relation to FIG. 2 and identified therein with the reference 200.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms comprising, including, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment proposes an electronic device. The electronic device comprises at least one chip on which at least one electronic component is integrated. In turn, the chip comprises at least one terminal of said at least one electronic component of a material comprising a first metal element. Moreover, the electronic device comprises at least one lead of a material comprising a second metal element different from the first metal element, and at least one bonding wire of a material comprising a selected one between the first metal element and the second metal element. The bonding wire has opposite ends coupled with the terminal and with the lead. The electronic device further comprises at least one interface element having a layer of a material comprising the selected metal element and a further layer of a material comprising the other metal element being unselected. The interface element has said layer coupled with the bonding wire and said additional layer coupled with a component consisting of the terminal or of the lead of the material comprising the unselected metal element.

However, the electronic device may be of any type, and it may comprise a chip (of any material) on which there is integrated any number of electronic components of any type; in addition, the chip may comprise any number of terminals of any type (for example, lands). Similarly, it is possible to provide any number of leads (also different from those of the terminals) of any type (for example, gull-wing type). Any number of bonding wires may have their ends coupled in any way (see below) with each terminal and lead. Each terminal, lead and bonding wire may be made of any material including any metal element. The interface elements may be in any number (for example, for only some most critical connections) and of any type (see below); in this case as well, the layers of each interface element may be made of any materials (even different from those of the terminals and the leads), and they may be coupled with the bonding wire and with the component at issue in any way (see below).

In an embodiment, the selected metal element is the second metal element; the interface element has said further layer coupled with the terminal.

Anyway, nothing prevents selecting the first metal element and coupling the layer of the interface element with the lead.

In an embodiment, the interface element comprises a bimetallic strip comprising said layer and said further layer superimposed one to another.

However, nothing prevents using a different interface element, for example, a strip comprising one or more additional layers interposed between the layer and the further layer.

In an embodiment, the bonding wire is soldered to said layer of the interface element and said further layer of the interface element is soldered to said component.

However, nothing prevents coupling the bonding wire with said layer of the interface element and/or said further layer of the interface element with said component by any technique (for example, by a heterogeneous soldering).

Generally, similar considerations apply if the electronic device has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. It should also be noted that (unless specified otherwise) any interaction between different components generally does not need to be continuous, and it may be either direct or indirect through one or more intermediaries.

A further embodiment provides a method for manufacturing an electronic device. The method comprises the following steps. A chip is provided on which at least one electronic component is integrated; said chip comprises at least one terminal of said at least one electronic component of a material comprising a first metal element. At least one lead of a material comprising a second metal element different from the first metal element is provided. At least one bonding wire of a material comprising a selected one between the first metal element and the second metal element is provided. Opposite ends of the bonding wire are coupled with the terminal and with the lead. The step of coupling the opposite ends of the bonding wire with the terminal and with the lead comprises the following steps. At least one interface element is provided having a layer of a material comprising the selected metal element and a further layer of a material comprising the other metal element being unselected. Said further layer is coupled with a component consisting of the terminal or of the lead of the material comprising the unselected metal element. The bonding wire is coupled with said layer of the interface element.

In an embodiment, the step of providing at least one bonding wire comprises providing at least one bonding wire of a material comprising the second metal element. Furthermore, the step of coupling said further layer with a component comprises coupling said further layer with the terminal.

In an embodiment, the step of providing at least one interface element includes providing a bimetallic strip comprising said layer and said further layer superimposed one to another.

In an embodiment, the step of coupling said further layer to a component comprises soldering said further layer to said component. Furthermore, the step of coupling the bonding wire with said layer of the interface element comprises soldering the bonding wire to the layer of the interface element.

However, the method may be applied in an alternative way in the same way as indicated above.

In an embodiment, the step of coupling the opposite ends of the bonding wire with the terminal and with the lead comprises using a coupling apparatus for performing the following steps. A free end portion of a tape reel is coupled with said component; the tape reel has another layer of a material comprising the selected metal element and a further another layer of a material comprising the unselected metal element. The tape reel is cut at least partially in correspondence to the end portion coupled with said component. A remaining part of the tape reel is separated from said end portion thereby obtaining the interface element coupled with said component.

However, nothing prevents performing further additional steps, such as coupling an intermediate portion of said tape reel with one or more further components.

In an embodiment, the step of coupling the opposite ends of the bonding wire with the terminal and with the lead comprises using a coupling apparatus for performing the following steps. A free end portion of a tape reel is coupled with said component; the tape reel has another layer of a material comprising the selected metal element and a further another layer of a material comprising the unselected metal element. The tape reel is unwound up to reach an intermediate portion thereof. The intermediate portion is coupled with a service element external to the chip and to said at least one lead. The tape reel is at least partially cut in correspondence to the intermediate portion coupled with said service element. A remaining part of the tape reel is separated from said intermediate portion thereby obtaining the interface element coupled with said component.

However, nothing prevents using a service element of any type and of any material, also external to the electronic device (then separating the intermediate portion from the end portion of the tape reel).

In general, the interface elements may be provided and coupled in any other way (for example, cutting them in advance and then coupling them with pick-and-place mechanisms).

In an embodiment, the step of coupling the opposite ends of the bonding wire with the terminal and with the lead comprises using the coupling apparatus for performing the following steps. A free end portion of a wire reel is coupled with said layer of the interface element; the wire reel is of said selected material. The wire reel is unwound to reach a connecting portion thereof. The connecting portion is coupled with said component. The wire reel is at least partially cut in correspondence to the connection portion coupled with said component. A remaining part of the wire reel is separated from the connection portion thereby obtaining the bonding wire with its opposite ends coupled with the terminal and with the lead.

However, nothing prevents using the coupling apparatus for coupling a plurality of bonding wires with the terminal or with the lead and/or to couple more than one terminal to the same lead. In any case, nothing prevents using different devices to provide and to couple the interface elements and the bonding wires.

In general, similar considerations may be applied if the same solution is implemented by an equivalent method (by using similar steps with the same functions of several steps or portions thereof, by removing some non-essential steps, or by adding additional optional steps); moreover, the steps may be performed in different order, in parallel or overlapped (at least in part).

What is claimed is:

1. An electronic device, comprising:
   at least one chip on which at least one electronic component is integrated, said chip comprising at least one terminal of said at least one electronic component comprising a first metal element,
   at least one lead made of a second metal element different from the first metal element,
   at least one bonding wire made of a selected one between the first metal element and the second metal element, the bonding wire having opposite ends coupled with the terminal and with the lead, and
   at least one interface element having a first layer made of the selected one of the first and second metal elements and a second layer made of an unselected one of the first and second metal elements,
   wherein said first layer is directly coupled with the bonding wire and wherein said second layer is directly coupled with a component comprising one of the terminal or the lead.

2. The electronic device according to claim 1, wherein the selected metal element is the second metal element, the interface element having said second layer coupled with the terminal.

3. The electronic device according to claim 1, wherein the interface element comprises a bimetallic strip comprising said first and second layers superimposed one to another.

4. The electronic device according to claim 1, wherein the bonding wire is soldered to said first layer of the interface element and said second layer of the interface element is soldered to said component.

5. A method for manufacturing an electronic device, comprising:
   providing a chip on which at least one electronic component is integrated, said chip comprising at least one terminal of said at least one electronic component comprising a first metal element;
   providing at least one lead made of a second metal element different from the first metal element;
   providing at least one bonding wire made of a selected one between the first metal element and the second metal element;
   coupling opposite ends of the bonding wire with the terminal and with the lead, wherein coupling comprises:
      providing at least one interface element having a first layer made of the selected one of the first and second metal elements and a second layer made of an unselected one of the first and second metal elements;
      directly coupling said second layer with a component comprising one of the terminal or the lead, and
      directly coupling the bonding wire with said first layer of the interface element.

6. The method according to claim 5,
   wherein providing at least one bonding wire comprises: providing at least one bonding wire made of the second metal element, and
   wherein coupling said second layer with a component comprises: coupling said second layer with the terminal.

7. The method according to claim 5, wherein providing at least one interface element comprises:
   providing a bimetallic strip comprising said first and second layers superimposed one to another.

8. The method according to claim 5,
   wherein directly coupling said second layer with a component comprises: soldering said second layer to the component, and
   wherein directly coupling the bonding wire with said first layer of the interface includes: soldering the bonding wire to the first layer of the interface element.

9. The method according to claim 5, wherein directly coupling the opposite ends of the bonding wire with the terminal and with the lead comprises using a coupling apparatus for:
   coupling a free end portion of a tape reel with said component, the tape reel having another layer made of the selected one of the first and second metal elements and a further another layer made of the unselected one of the first and second metal elements;
   at least partially cutting the tape reel in correspondence to the end portion coupled with said component, and
   separating a remaining part of the tape reel from said end portion thereby obtaining the interface element coupled with said component.

10. The method according to claim 5, wherein directly coupling the opposite ends of the bonding wire with the terminal and with the lead comprises using a coupling apparatus for:
   coupling a free end portion of a tape reel with said component, the tape reel having another layer made of the selected one of the first and second metal elements and a further another layer made of the unselected one of the first and second metal elements;
   unwinding the tape reel up to reach an intermediate portion thereof;
   coupling the intermediate portion with a service element external to the chip and to said at least one lead,
   at least partially cutting the tape reel in correspondence to the intermediate portion coupled with said service element, and
   separating a remaining part of the tape reel from said intermediate portion thereby obtaining the interface element coupled with said component.

11. The method according to claim 5, wherein directly coupling the opposite ends of the bonding wire with the terminal and with the lead comprises using the coupling apparatus for:
   coupling a free end portion of a wire reel with said layer of the interface element, the wire reel being of said selected one of the first and second metal elements;
   unwinding the wire reel to reach a connecting portion thereof;
   coupling the connecting portion with said component,
   at least partially cutting the wire reel in correspondence to the connection portion coupled with said component, and separating a remaining part of the wire reel from the connection portion thereby obtaining the bonding wire with its opposite ends coupled with the terminal and with the lead.

12. An electronic device, comprising:
an integrated circuit chip having terminal made of a first metal material;
a lead made of a second metal material;
a wire bond made of a third metal material, wherein the third metal material includes at least one of the first and second metal materials;
a bimetal strip positioned in contact with at least one of the terminal and the lead, wherein the bimetal strip comprises a first layer made of the first metal material and a second layer made of the second metal material, the wire bond being formed at least in part by the bimetal strip.

13. The device of claim 12, where the bimetal strip is positioned in contact with the terminal and the first layer and the terminal are made of the first metal material, and the second layer is made of the second metal material.

14. The device of claim 12, wherein the bimetal strip is positioned in contact with the lead and the first layer and the lead are made of the second metal material, and the second layer is made of the first metal material.

15. The device of claim 12, wherein the wire bond comprises a bonding wire directly coupled at a first end to the bimetal strip and directly coupled at a second end to either the terminal or the lead.

16. The device of claim 12, wherein the bimetal strip is positioned in contact with at least one of the terminal and the lead comprises the bimetal strip being soldered to the at least one of the terminal and the lead.

* * * * *